United States Patent [19]

Stuermer

[11] 4,047,113
[45] Sept. 6, 1977

[54] FEEDBACK CIRCUITRY FOR CHARGE DIGITIZER

[75] Inventor: Karl Stuermer, Mentor, Ohio

[73] Assignee: Sheller-Globe Corporation, Cleveland, Ohio

[21] Appl. No.: 686,044

[22] Filed: May 13, 1976

[51] Int. Cl.² .................. G01R 19/26; H01J 39/12
[52] U.S. Cl. ........................... 328/2; 307/311; 324/99 D; 250/551; 250/211 R
[58] Field of Search ............... 307/311; 328/2; 250/551, 211 R, 214 A, 214 SW, 214 SF, 214 AG; 324/99 D

[56] References Cited

U.S. PATENT DOCUMENTS

| | | | |
|---|---|---|---|
| 2,869,044 | 1/1959 | Horwege et al. | 250/214 SW |
| 3,011,101 | 11/1961 | Boyce | 328/2 |
| 3,510,750 | 5/1970 | Horino et al. | 307/311 |
| 3,566,265 | 2/1971 | Reid | 324/99 D |
| 3,660,666 | 5/1972 | Hendrickson | 250/214 SW |
| 3,716,849 | 2/1973 | Metcalf | 324/99 D |
| 3,768,009 | 10/1973 | Dorey et al. | 324/99 D |
| 3,952,205 | 4/1976 | Tobey et al. | 307/311 |

Primary Examiner—John S. Heyman
Attorney, Agent, or Firm—William N. Hogg

[57] ABSTRACT

Feedback circuitry for a charge digitizer is disclosed. The feedback circuitry includes a photo-diode coupled between the input of the integrator and the biasing voltage of the photo-diode and a pulsed light source connected to the output of the multivibrator of the digitizer. The pulsed light source is operative responsive to the output pulses of the multivibrator and will actuate the photo-diode upon each pulse to discharge the integrating capacitor. Preferably, the photo-diode is specially constructed to have a grounded guard ring separating the anode and the cathode portions of the envelope to thereby prevent unintended current flow on or through the envelope. This provides a normally open feedback circuit with current flow only during the pulsed intervals.

3 Claims, 2 Drawing Figures

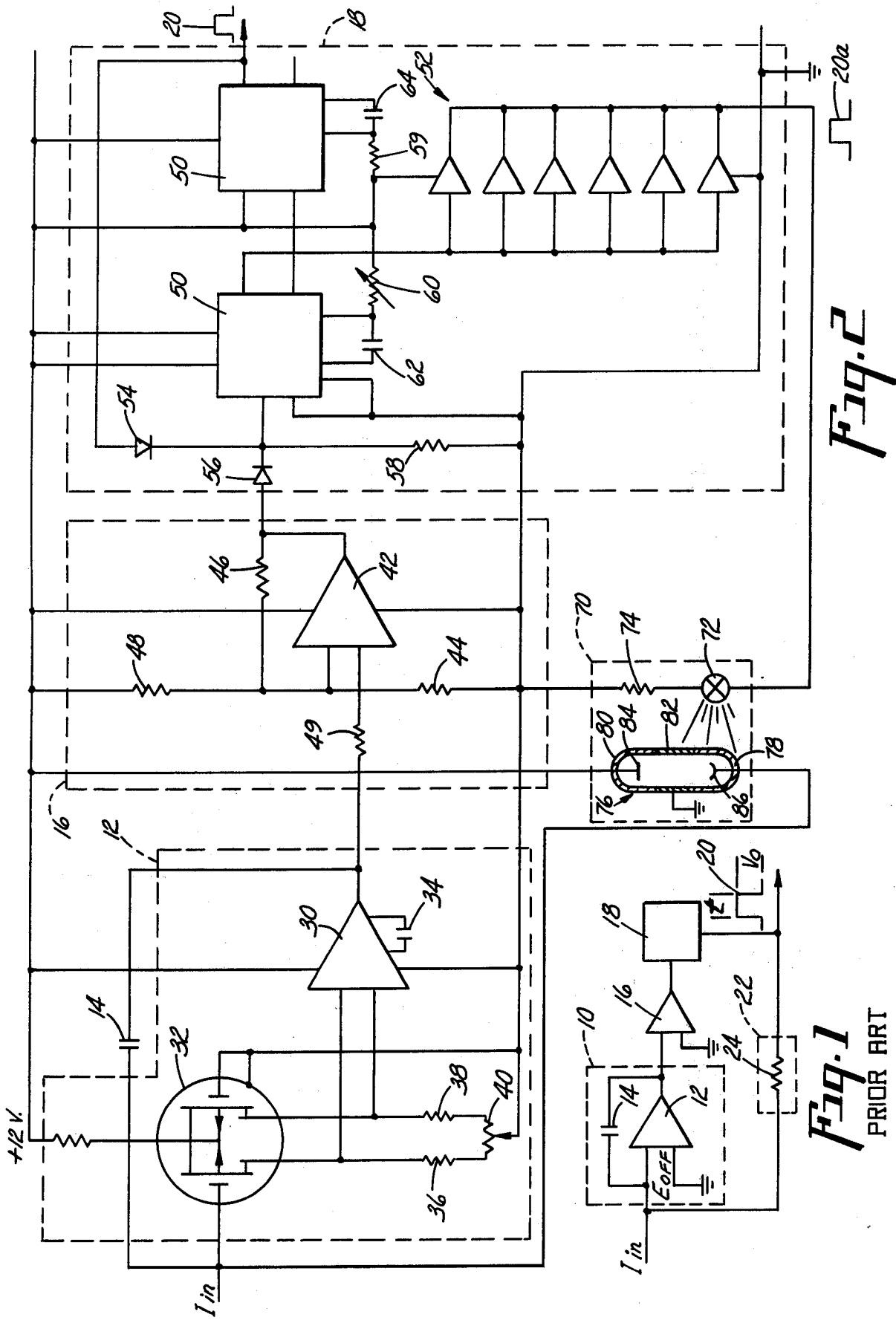

FEEDBACK CIRCUITRY FOR CHARGE DIGITIZER

BACKGROUND OF THE INVENTION

This invention relates generally to feedback circuitry for charge digitizers, and more particularly to an improved feedback circuitry which will minimize transient voltages and also minimize the effect of variations in the input offset voltage of the integrating electrometer.

In the measurement of small currents or charges such as those encountered in ionization chambers, circuitry under the general title of charge digitizers or current to frequency converters is presently utilized so that the current or charge information can be treated digitally.

In this circuitry an input current charges an integrating capacitor until a following comparator is tripped which forces a monostable multivibrator to provide an output of rectangular voltage pulses. The voltage pulses cause similar current pulses in such a way that each current pulse is equal to a specific charge, and thus the pulse repetition rate is proportional to the input current.

In this type of charge digitizer, there is feedback circuitry to discharge the integrating capacitor, the feedback being initiated by the pulses of the multivibrator so that upon each pulsing of the multivibrator, the integrating capacitor is discharged. Conventionally this feedback circuitry has consisted of a resistor connected between the output of a multivibrator and the capacitor. This type of circuit has two major drawbacks.

First, the feedback circuit causes transient voltages at the edges of the feedback pulse which, while compensating each other, still can drive the integrator output beyond its dynamic range.

The second drawback, and by far the more serious, is that of variations in the input offset voltage of the electrometer, which can and will cause a false signal current of sufficient magnitude to adversely affect the output of the device and give false readings. Expressed another way, there is, in effect, a zero shift in the device which, for very small currents often involved in this type of device, is quite serious, and is especially pronounced when temperature varies.

While it is possible to reduce the erroneous current to some extent in the feedback circuit by utilizing a switch in the line which switch is normally open and closes only when there is a pulse current; nevertheless, this solution is not entirely satisfactory for general application since reed switches are too slow for general application and MOSFETS cause even larger transients which are extremely difficult to compensate for adequately.

SUMMARY OF THE INVENTION

According to the present invention, an improved feedback circuit for a charge digitizer is provided which includes a photo-diode coupled between the input of the integrator and the biasing voltage for the photo-diode, and a pulsed light source connected to the output of the multivibrator of the digitizer, the pulsed light source being operative responsive to pulses from the multivibrator. The light source is positioned to illuminate the cathode of the photo-diode to cause pulse current flow to discharge the capacitor when the light source is illuminated, thus providing an open feedback circuit during the absence of light pulses. Preferably, the photo-diode is a vacuum type photodiode and is provided with a guard ring separating the anode portion from the cathode portion to thereby minimize any unintended current flow either through or across the envelope portion of the photo-diode tube.

DESCRIPTION OF THE PREFERRED EMBODIMENT

Referring now to the drawing, and initially to FIG. 1, a schematic representation of a conventional charge digitizer with prior art feedback circuitry is shown. The charge digitizer includes an integrator 10 comprised of an operational amplifier unit 12 and an integrating capacitor 14. Input signal, such as from an ionization chamber is shown by the designation $I_{in}$. Coupled to the integrator 10 is a comparator 16, the output of which is supplied to a monostable multivibrator unit 18 which has output pulses shown as 20 having a magnitude $V_O$ and a time $t$. A feedback circuit 22 is provided which includes a resistor 24 connected between the output of the multivibrator unit 18 and the capacitor 14 to discharge the capacitor 14 upon each pulse. This represents a conventional prior art and as discussed above, the continuously closed feedback circuit has the problem of distributed capacitance across the resistor 24 causing transient voltages at the edges of the pulse and also the input offset voltage shown as $E_{off}$ may vary which can cause a false signal current of magnitude $E_{off}$/resistor 24.

FIG. 2 is a circuit diagram showing in broken outline the various components of the charge digitizing circuit, incorporating the improved feedback circuitry of the present invention. In this circuitry there is the integrator 10 comprised of the operational amplifier unit 12 and integrating capacitor 14, the comparator 16, and the gated multivibrator unit 18.

Specifically and in more detail, the various components of a preferred circuit for charge digitizing is shown within the broken outlines. The operational amplifier unit 12 is comprised of a conventional operational amplifier 30 such as RCA type CA3130, coupled to a field effect transistor such as MOSFET VICO No. 32159 manufactured by Victoreen Instrument Company, designated by the reference character 32. A capacitor 34 is connected to the operational amplifier 30 for compensating, and a pair of resistors 36 and 38 are coupled to the transistor 32, and to a potentiometer 40 for zero setting.

The comparator 16 includes an operational amplifier 42 also preferably an RCA part CA3130, and resistors 44, 46, 48 and 49.

The multivibrator unit 18 includes dual monostable multivibrators 50 which are sold together as a unit such as Motorola part No. NC14528. The dual configuration is required to provide a gated multivibrator unit. The multivibrator unit also includes a non-inverting hex buffer 52 which supplies a pulse of sufficient voltage to operate the feedback circuit. The multivibrator unit 18 also includes a pair of diodes 54 and 56, resistors 58 and 59, variable resistor 60, and capacitors 62 and 64. The pulse output 20 is shown from the multivibrator. Also, a pulse output to the feedback circuit is shown and designated by the reference character 20a.

The improved feedback circuit of the present invention is designated by the reference character 70 and is shown in broken outline. The feedback circuit 70 includes a light emitting diode 72 coupled to the multivibrator through resistor 74, and a vacuum photo-diode tube 76. Preferably, the vacuum photo-diode tube 76 is of the construction shown which includes an envelope comprised of a cathode end 78 and an anode end 80, each formed of conventional glass, and grounded by a guard ring 82 formed of metal or other electrically conductive material which is grounded. The tube includes an anode 84 connected to a source of voltage and a cathode 86 connected to the capacitor 14. The light emitting diode 72 is positioned so as to illuminate the cathode 86. It is to be understood that this is a specially constructed tube and is designed specifically to prevent leakage across the tube from the anode to the cathode through the glass, this being accomplished by grounding of the electrically conducting central guard ring 82. However, where electron flow is not a problem, or can be tolerated, it may be possible to use conventional photo-diodes, preferably vacuum photo-diode, such as type 1P42 manufactured by RCA.

With a feedback circuit according to the present invention, there is a continuous open circuit maintained between the output and the input to the integrating capacitor 14, except when there is current flow through the photo-diode 76. This current flow occurs only when the cathode 86 is illuminated by the light emitting diode, which lighting occurs responsive to pulses from the multivibrator. Thus, the effect of the offset voltage on the feedback discharge of the capacitor is minimized due to the fact that the feedback circuit is a closed circuit only during the pulsing and not continuously. Hence, the percentage effect of any change of $E_{off}$ is minimized.

It is to be understood that the circuitry of the charge digitizer other than the feedback circuitry 70 is merely illustrative and not limiting of the various types of circuitry that can be utilized in a charge digitizer with the feedback circuitry of the present invention.

What is claimed is:

1. In a charge digitizer wherein the current to be measured is applied to an electronic integrator which includes capacitor means, high input impedence amplifier means, and wherein the output from the integrator is applied to a comparator, and wherein the comparator gates a multivibrator to produce pulses responsive to the output from the comparator, an improved feedback circuitry comprising, a vacuum photo-diode coupled between the input of the integrator and a biasing voltage for the photo-diode, and a pulse light source connected to the output of the multivibrator and operative responsive to pulses therefrom, said light source being positioned to illuminate the cathode of the photo-diode to cause pulse current flow to discharge the capacitor means when the light source is illuminated, and guard ring means on said photo-diode to prevent unintended current flow between the anode and cathode, whereby an open feedback circuit is maintained during the absence of light pulses.

2. The invention as defined in claim 1 wherein said guard ring is grounded.

3. The invention as defined in claim 1 wherein the envelope of the photo-diode is in part defined by said guard ring and said guard ring separates the anode portion of the tube from the cathode section of the tube.

* * * * *